(12) United States Patent
McLaurin

(10) Patent No.: US 8,106,403 B2
(45) Date of Patent: Jan. 31, 2012

(54) III-NITRIDE LIGHT EMITTING DEVICE INCORPORATION BORON

(75) Inventor: Melvin B. McLaurin, Mountain View, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 267 days.

(21) Appl. No.: 12/397,417

(22) Filed: Mar. 4, 2009

(65) Prior Publication Data

US 2010/0224852 A1   Sep. 9, 2010

(51) Int. Cl.
*H01L 29/26* (2006.01)
(52) U.S. Cl. .................. 257/79; 257/E33.028
(58) Field of Classification Search ........... 257/79, 257/E33.028
See application file for complete search history.

(56) References Cited

U.S. PATENT DOCUMENTS

| 6,274,924 | B1 | 8/2001 | Carey et al. |
| 6,359,292 | B1 | 3/2002 | Sugawara et al. |
| 6,836,496 | B1 * | 12/2004 | Kano et al. ............... 372/43.01 |
| 6,903,364 | B1 * | 6/2005 | Takayama et al. ............ 257/12 |
| 7,391,062 | B2 * | 6/2008 | Takayama et al. ........... 257/187 |

OTHER PUBLICATIONS

"Metal-organic vapour phase epitaxy of BInGaN quaternary alloys and characterization of boron content" Gautier et al. 2010. Journal of Crystal Growth, v. 312, iss. 5, p. 641-644.*

By A. Ougazzaden et al. Entitled: "Bandgap Bowing in BGaN Thin Films"; Applied Physics Letter 93, 083118(2008); Downloaded Sep. 2, 2008 to 207.47.13.01.; pp. 1-3.

By A. Ougazzaden et al. Entitled: "BGaN Material on GaN/Saphire Substrate by Movpe Using N2 Carrier Gas"; Available online at www.sciencedirect.com, Dec. 8, 2006; Elsevier; Journal of Crystal Growth 298 (2007); pp. 316-319.

* cited by examiner

*Primary Examiner* — Thao Le
*Assistant Examiner* — Allen Parker

(57) ABSTRACT

Embodiments of the invention include a III-nitride semiconductor structure comprising a light emitting region disposed between an n-type region and a p-type region. At least one layer in the light emitting region is $B_x(In_yGa_{1-y})_{1-x}N$. In some embodiments, x is less than 14%. In some embodiments, the BN composition is selected such that the $B_x(In_yGa_{1-y})_{1-x}N$ layer has the same band gap energy as a comparable InGaN layer, with a bulk lattice constant that is the same or smaller than the comparable InGaN layer.

18 Claims, 4 Drawing Sheets

III-NITRIDE LIGHT EMITTING DEVICE INCORPORATION BORON

FIELD OF THE INVENTION

This invention relates to the field of semiconductor light emitting devices, and more specifically to III-nitride light emitting devices.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, composite, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

III-nitride devices are often grown on sapphire or SiC substrates. In conventional devices, an n-type GaN region is grown on the substrate, followed by an InGaN active region, followed by an AlGaN or GaN p-type region. The difference in lattice constant between the non-III-nitride substrate and the III-nitride layers, as well as the difference in lattice constant between III-nitride layers of different composition, causes strain in the device. The strain energy due to lattice mismatch can cause defects and decomposition of the InGaN active region, which may cause poor device performance. Since the strain energy is a function of both the composition of the InGaN light emitting layer (which determines the amount of strain) and the thickness of the light emitting layer, both the thickness and composition are limited in conventional III-nitride devices.

Ougazzaden et al. *Bandgap bowing in BGaN thin films*, Applied Physics Letters 93, 083118 (2008) reports on "thin films of $B_xGa_{1-x}N$ grown on AlN/sapphire substrates using metal-organic vapor phase epitaxy." See, for example, Abstract. "Ternary and quaternary layers of nitrides are important for bandgap engineering of GaN-based optoelectronic devices. The introduction of boron, which is a 'light' element, could, in principle, compensate for the strain induced by a high fraction of 'heavy' indium in InGaN-based light emitters and could provide lattice matching for BGaN grown on AlN and SiC substrates." See, for example, the first paragraph in the first column on the first page of Ougazzaden et al.

SUMMARY

An object of the invention is to provide a III-nitride device where at least one layer in the light emitting region includes boron. Embodiments of the invention include a III-nitride semiconductor structure comprising a light emitting region disposed between an n-type region and a p-type region. At least one layer in the light emitting region is $B_x(In_yGa_{1-y})_{1-x}N$. The $B_x(In_yGa_{1-y})_{1-x}N$ layer has a band gap energy and a bulk lattice constant corresponding to a lattice constant of a relaxed layer having a same composition as the $B_x(In_yGa_{1-y})_{1-x}N$ light emitting layer. An InGaN layer having a same band gap energy as the $B_x(In_yGa_{1-y})_{1-x}N$ layer has a bulk lattice constant corresponding to a lattice constant of a relaxed layer having a same composition as the InGaN layer. The bulk lattice constant of the $B_x(In_yGa_{1-y})_{1-x}N$ layer is less than the bulk lattice constant of the InGaN layer.

DETAILED DESCRIPTION

In accordance with embodiments of the invention, boron is incorporated into one or more layers of a III-nitride device. Incorporating boron into layers of a III-nitride device, particularly in the active region of the device, may reduce the strain in the device, which may improve the performance of the device.

Figure 1:
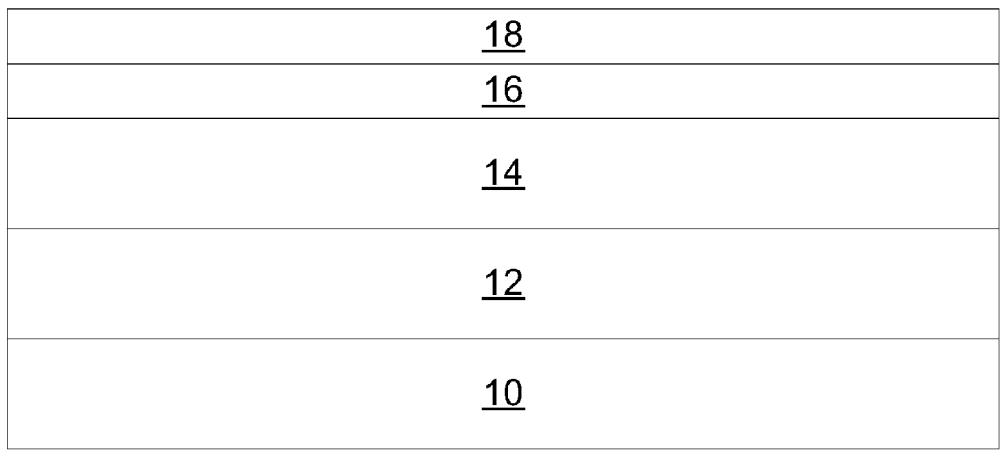
FIG. 1 illustrates a portion of a III-nitride light emitting device according to embodiments of the invention.

FIG. 1 illustrates an embodiment of the invention. A first single crystal layer 12 is grown over a suitable growth substrate 10. The first single crystal layer 12 determines the lattice constant of all the III-nitride layers grown over it. The composition and growth conditions of first single crystal layer 12 may determine the lattice constant. An active or light emitting region 16 is grown over the first single crystal layer 12, sandwiched between an n-type region 14 and a p-type region 18.

N-type region 14 and first single crystal layer 12 may include multiple layers of different compositions and dopant concentration including, for example, preparation layers such as buffer layers or nucleation layers grown before or after first single crystal layer 12, which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light. In some embodiments, a portion of n-type region 14 closest to the growth substrate is the first single crystal layer grown in the device, and a separate first single crystal layer 12 is omitted.

P-type region 18 is grown over light emitting region 16. Like the n-type region, the p-type region may include multiple layers of different composition, thickness, and dopant concentration, including layers that are not intentionally doped, or n-type layers.

Active region 16 is grown over n-type region 14. Examples of suitable light emitting regions, as described below, include a single thick or thin light emitting layer, or a multiple quantum well light emitting region including multiple thin or thick quantum well light emitting layers separated by barrier layers. For example, a multiple quantum well light emitting region may include multiple light emitting layers, each with a thickness of 25 Å or less, separated by barriers, each with a thickness of 100 Å or less.

In some embodiments, the thickness of each of the light emitting layers in the device is thicker than 50 Å. In some embodiments, the light emitting region of the device is a single, thick light emitting layer with a thickness between 50 and 600 Å, more preferably between 100 and 400 Å. The optimal thickness may depend on the number of defects within the light emitting layer. The concentration of defects in the light emitting region is limited to less than $10^9$ cm$^{-2}$ in some embodiments, to less than $10^8$ cm$^{-2}$ in some embodiments, to less than $10^7$ cm$^{-2}$ in some embodiments, and to less than $10^6$ cm$^{-2}$ in some embodiments.

In some embodiments, at least one light emitting layer in the device is doped with a dopant such as Si to a dopant concentration between $1\times10^{13}$ cm$^{-3}$ and $1\times10^{20}$ cm$^{-3}$. Si doping may further reduce the strain in the light emitting layer. In some embodiments, the light emitting layer or layers are not intentionally doped.

Figure 2:
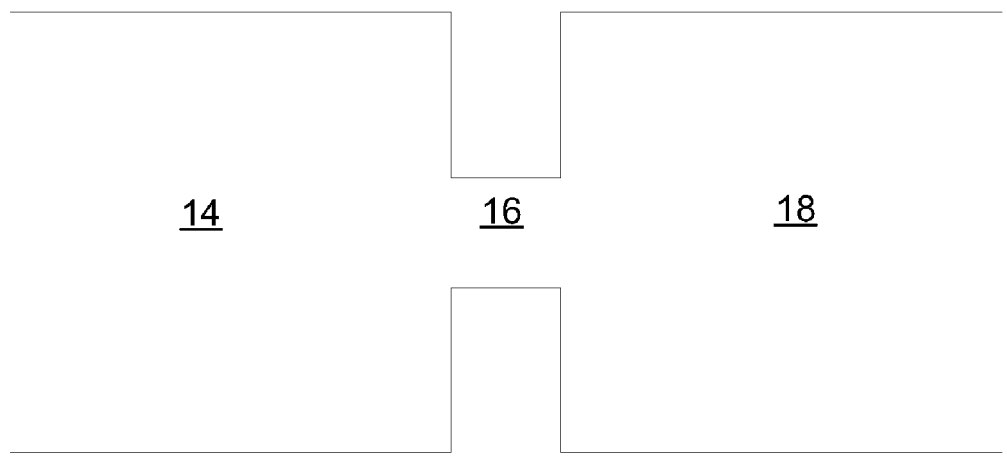
FIGS. 2, 3, and 4 are plots of ideal band gap energy as a function of position for portions of III-nitride devices according to embodiments of the invention.
Figure 3:
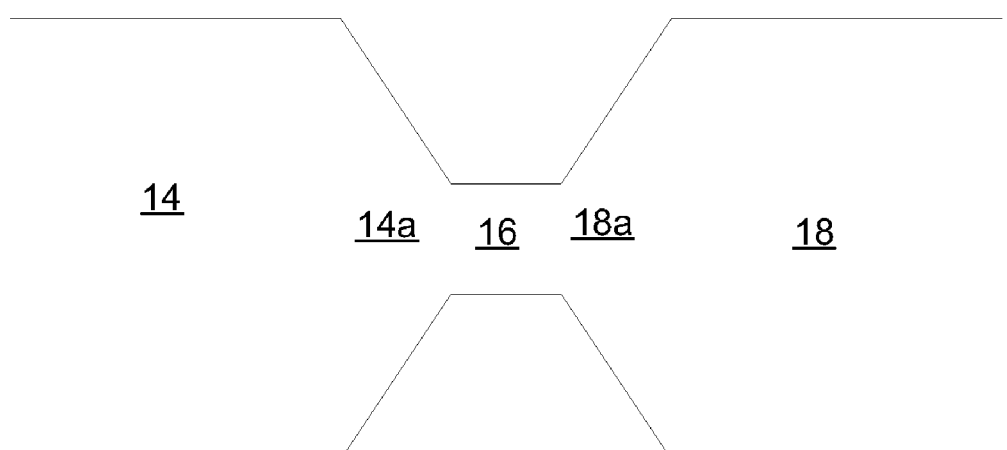
Figure 4:
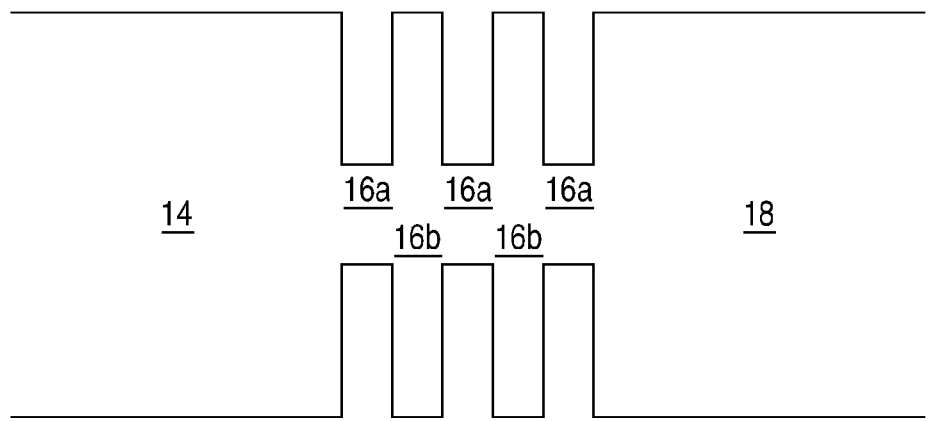

FIGS. 2-4 illustrate ideal band gap as a function of position for portions of light emitting devices according to embodiments of the invention. The band gaps illustrated are ideal, and therefore a function of composition only. Effects in real devices which may distort the band gap diagram, such as polarization, are not illustrated in FIGS. 2-4.

In the device illustrated in FIG. 2, active region 16 includes a single light emitting layer. The light emitting layer may be a quaternary alloy of boron, indium, gallium, and nitrogen. The boron and indium composition are selected for the desired band gap in the light emitting layer, which determines the wavelength of emitted light. The portion of n-type region 14 adjacent active region 16 may be, for example, GaN or InGaN. The portion of p-type region 18 adjacent active region 16 may be, for example, GaN, InGaN, or AlGaN. The composition of n-type region 14 and p-type region 18 are selected such that the change in band gap between n-type region 14 and active region 16, and between active region 16 and p-type region 18, sufficiently confines electrons and holes in the active region. The difference between the band gap energy in the light emitting layers of active region 16 and the portions of n- and p-type regions 14 and 18 immediately adjacent the active region may be at least several times kT, which is 0.026 eV at room temperature. For example, the difference may be at least 0.1 eV in some embodiments, at least 0.15 eV in some embodiments.

In the device illustrated in FIG. 3, active region 16 includes a single light emitting layer, as described above in reference to FIG. 2. The composition in one or both of the n-type region and the p-type region adjacent the light emitting layer is graded. For example, the portion of n-type region 14 adjacent graded region 14a may be GaN. In graded region 14a, the composition may be graded from GaN to InGaN to the BInGaN composition in light emitting layer 16. Similarly, the portion of p-type region 18 adjacent graded region 18a may be GaN. In graded region 18a, the composition may be graded from the BInGaN composition in light emitting layer 16 to InGaN to GaN. The composition profile on either side of the active region 16 need not be symmetrical as illustrated in FIG. 3, and any graded region need not be linearly graded, as illustrated in FIG. 3. In some embodiments, the composition on only one side of active region 16 is graded. In some embodiments, a graded region as illustrated in FIG. 3 is combined with a step change in composition, as illustrated in FIG. 2. For example, the composition may be graded from GaN to InGaN in graded region 14a, then changed from InGaN to the BInGaN composition in active region 16 in a step change.

In the device illustrated in FIG. 4, active region 16 is a multiple quantum well active region with quantum well layers separated by one or more barrier layers. Though three quantum well layers 16a and two barriers 16b are shown in FIG. 4, more or fewer quantum well layers may be included in active region 16. Quantum wells 16a may be BInGaN, where the boron and indium compositions are selected for the desired band gap in the light emitting layer. Barrier layers 16b may be GaN, or InGaN at an indium composition having a band gap larger than the band gap in quantum wells 16a. Alternatively, quantum wells 16a may be InGaN and barrier layers 16b may be BInGaN with a boron and indium composition selected to have a band gap larger than the band gap in quantum wells 16a.

The multiple quantum well active region illustrated in FIG. 4 may be combined with graded composition n- and/or p-type regions, as described above in the text accompanying FIG. 3.

A III-nitride layer in a device may be characterized by lattice constant. As used herein, the "in-plane" lattice constant refers to the actual lattice constant of a layer within the device. The "bulk" lattice constant refers to an ideal lattice constant of relaxed, free-standing material of a given composition. When the in-plane and bulk lattice constants of a layer are the same, the layer is relaxed, or free of strain. The amount of strain in a layer is defined as: strain=|ε|=|($a_{in-plane}$−$a_{bulk}$)|/$a_{bulk}$. Though this equation refers to the a-lattice constant and thus defines the strain in c-plane wurtzite, in wurtzite layers of other orientations, strain may be measured using lattice constants other than the a-lattice constant, or using more than one lattice constant. Layers may be lattice-matched for one lattice constant, and strained for another lattice constant.

In some embodiments, the composition in BInGaN light emitting layers are selected to have a bulk lattice constant that matches or is close to the in-plane lattice constant of first single crystal layer 12, shown in FIG. 1. First single crystal layer 12 is often GaN, with an in-plane a-lattice constant of about 3.189 Å.

The band gap $E_g$ of an alloy $A_xB_{1-x}C$ may be expressed by:

$$E_g^{ABC}=xE_g^{AC}+(1-x)E_g^{BC}+x(1-x)B,$$

where B is band gap bowing parameter, which describes any non-zero curvature of a band gap vs. composition line. When the bowing parameter is zero, the relationship between band gap and composition is referred to as a Vegard's law relationship. Ternary alloys of aluminum, indium, gallium, and nitrogen (i.e., alloys that do not contain boron) at low indium compositions (for example, less than 30% InN) have bulk lattice constants that typically follow Vegard's law.

Figure 5:
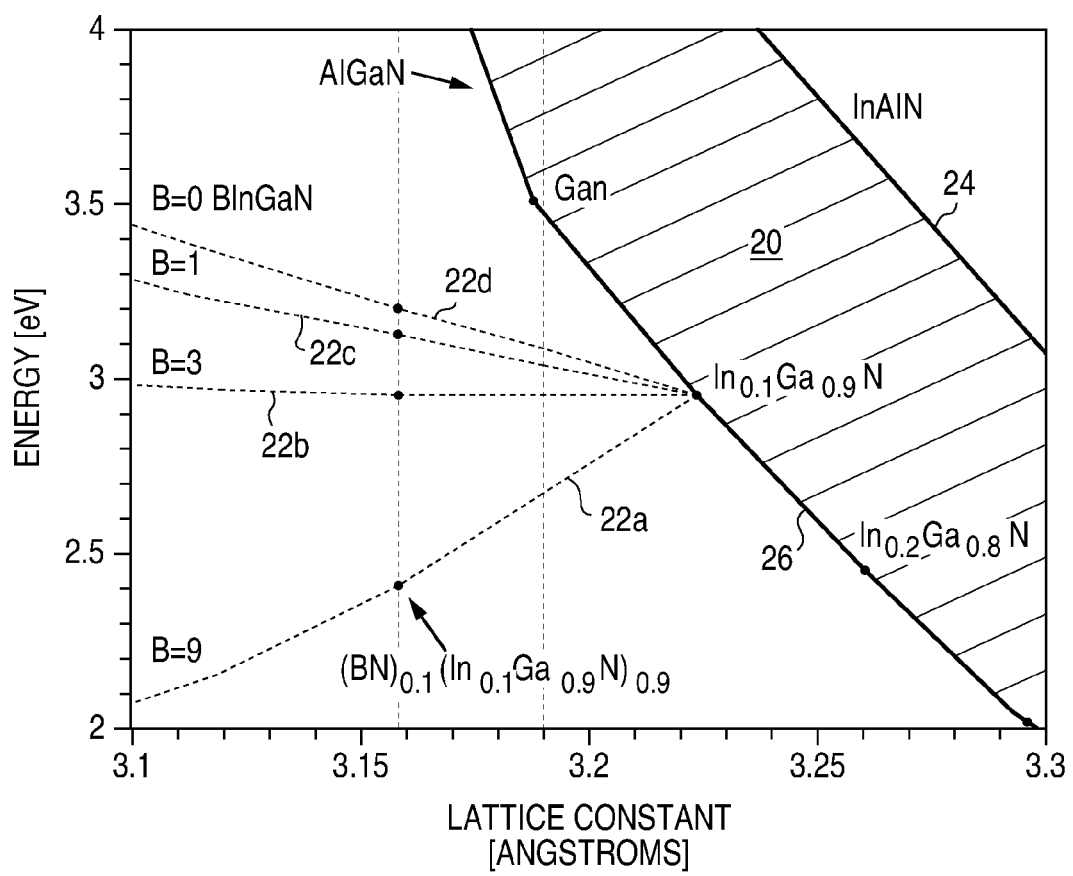
FIG. 5 is a plot of band gap energy as a function of lattice constant for binary, ternary, and quaternary alloys of aluminum, boron, gallium, indium, and nitrogen.

FIG. 5 is a plot of lattice constant as a function of band gap energy for several III-nitride alloys. GaN, and ternary alloys of aluminum, gallium, indium, and nitrogen are represented by lines 24 and 26. Shaded region 20 represents quaternary alloys of aluminum, gallium, indium, and nitrogen. While it is possible to grown AlGaInN alloys that are lattice matched to GaN, as illustrated in FIG. 5, they all have band gaps larger than GaN, making them potentially useful for UV applications, but less useful for LEDs emitting light at visible wavelengths. For band gaps narrower than GaN, the InGaN ternary represents the narrowest band gap achievable in the aluminum, gallium, indium, and nitrogen materials system at a given lattice constant.

Dashed lines 22a-22d illustrate quaternary alloys of boron, gallium, indium, and nitrogen with 10% BN for different band gap bowing parameters B, assuming a band gap energy of wurtzite boron nitride (BN) of 5.5 eV. Line 22a represents B=9 eV, line 22b represents B=3 eV, line 22c represents B=1 eV, and line 22d represents B=0. Unlike aluminum, gallium, indium, and nitrogen alloys, which typically exhibit a Vegard's law relationship between band gap and composition, the band gap bowing parameter B in boron, gallium, indium, and nitrogen alloys appears to be non-zero, perhaps as large as 9 eV. As illustrated by lines 22a-22d in FIG. 5, however, at relatively small boron compositions, the addition of boron to InGaN layers reduces the band gap, and may permit growth of quaternary BInGaN layers that are lattice-matched to GaN and have smaller band gaps than GaN.

As illustrated in FIG. 5, the addition of BN to an InGaN alloy reduces the lattice constant. In some embodiments, boron is added to the active region of the device, to reduce the lattice constant in the active region for a given band gap energy in the light emitting layers of the active region. In some embodiments, boron-containing layers may be latticed-matched to GaN. Such compositions are illustrated by dashed line 27 in FIG. 5. Quaternary alloys of boron, indium, gallium, and nitrogen on the right side of line 27 are in compression when grown on GaN. Quaternary alloys of boron, indium, gallium, and nitrogen on the left side of line 27 are in tension when grown on GaN. In some embodiments, the amount of boron in any layer in the device is limited such that the layer is in compression when grown on GaN. Possible quaternary alloys of boron, indium, gallium, and nitrogen in such embodiments are represented by the triangle between lines 26 and 27.

For example, a conventional III-nitride device that emits blue light, or light with a wavelength between 430 and 480 nm, may have an InGaN light emitting layer with an InN composition between, for example, 10% and 14%. One example, an $In_{0.12}Ga_{0.88}N$ light emitting layer, has a bulk a-lattice constant of 3.23 Å. The light emitting layers in such a device are typically grown over a GaN layer with a lattice constant of about 3.189 Å, and thus have an in-plane a-lattice constant of 3.189 Å. The amount of strain in the light emitting layers of such a device is the difference between the in-plane and bulk lattice constants in the light emitting layer, divided by the bulk lattice constant, or |(3.189 Å−3.23 Å)|/3.23 Å×100%, about 1.23%. In some embodiments of the invention, at least one light emitting layer in a blue-emitting device is BInGaN. The amount of BN in the light emitting layer is selected such that the band gap energy or emission color of the light emitting layers is the same as in the conventional blue-emitting device described above, but with a smaller bulk lattice constant in the light emitting layer, and therefore less strain. For example, the amount of BN in the light emitting layer might be selected such that the strain is less than 1% in some embodiments, less than 0.5% in some embodiments. The BN composition x added to the above-described blue-emitting InGaN light emitting layer, resulting in a light emitting layer with the composition $B_x(In_yGa_{1-y})_{1-x}N$, may be, for example, $0<x\leq0.1$ in some embodiments, $0.06\leq x\leq 0.08$ in some embodiments.

A conventional III-nitride device that emits cyan light, or light with a wavelength between 480 and 520 nm, may have an InGaN light emitting layer with an InN composition between, for example, 14% and 18%. The amount of strain in an $In_{0.16}Ga_{0.84}N$ light emitting layer grown on GaN is about 1.7%. In some embodiments of the invention, at least one light emitting layer in a cyan-emitting device is BInGaN. The amount of BN in the light emitting layer might be selected such that the band gap or emission color of the light emitting layer is the same, and the strain is less than 1.5% in some embodiments, less than 1% in some embodiments. The BN composition x added to the above-described cyan-emitting InGaN light emitting layer, resulting in a light emitting layer with the composition $B_x(In_yGa_{1-y})_{1-x}N$, may be, for example, $0<x\leq0.12$ in some embodiments, $0.08\leq x\leq 0.11$ in some embodiments.

A conventional III-nitride device that emits green light, or light with a wavelength between 520 and 560 nm, may have an InGaN light emitting layer with an InN composition between, for example, 18% and 22%. The amount of strain in an $In_{0.2}Ga_{0.8}N$ light emitting layer grown on GaN is about 2.1%. In some embodiments of the invention, at least one light emitting layer in a green-emitting device is BInGaN. The amount of BN in the light emitting layer might be selected such that the band gap or emission color of the light emitting layer is the same, and the strain is less than 2% in some embodiments, less than 1% in some embodiments. The BN composition x added to the above-described green-emitting InGaN light emitting layer, resulting in a light emitting layer with the composition $B_x(In_yGa_{1-y})_{1-x}N$, may be, for example, $0<x\leq0.14$ in some embodiments, $0.11\leq x\leq 0.13$ in some embodiments.

Figure 8:
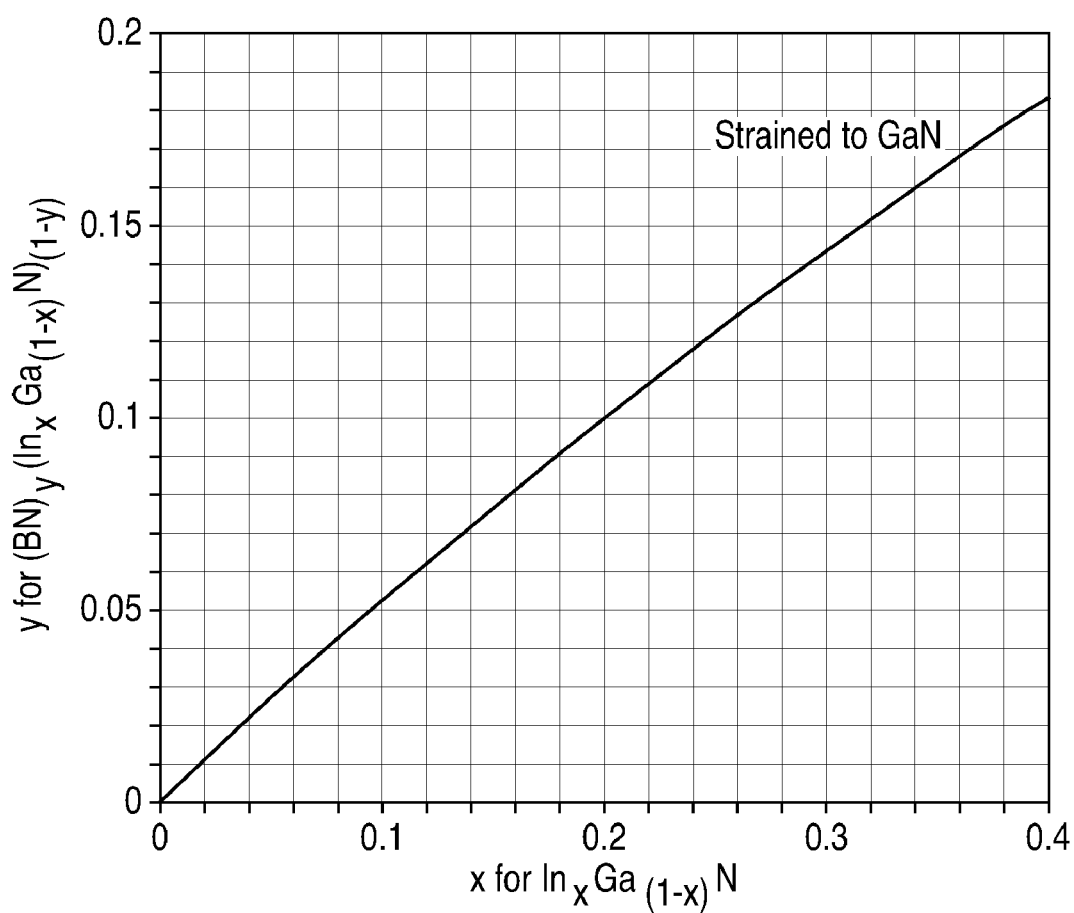
FIG. 8 is a plot of BN composition as a function of InN composition for BInGaN layers that are lattice-matched to GaN.

In embodiments where BN is incorporated in at least one of the barrier layers in a multiple quantum well device, the amount of BN is selected such that the band gap in the barrier layer is large enough to confine carriers in the light emitting layers and strain in the barrier layer or the light emitting layers is reduced as compared to a device with no boron in the barrier layers. FIG. 8 is a plot of BN composition as a function of InN composition for BInGaN layers that are lattice-matched to GaN. The x-axis represents an $In_xGa_{1-x}N$ composition on which the $(BN)_y(In_xGa_{1-x}N)_{1-y}$ alloy is based. The y-axis represents the BN composition in the $(BN)_y(In_xGa_{1-x}N)_{1-y}$ alloy.

The composition of BN in any boron-containing layers in devices according to embodiments of the invention is kept small enough that the boron-containing layers are wurtzite layers. At high enough BN composition, III-nitride layers may become zincblende.

BInGaN may be grown, for example, over III-nitride layers grown on a c-axis oriented sapphire substrate, in a low-pressure MOVPE reactor with 100% nitrogen as a carrier gas. Triethylboron, trimethylindium, trimethylgallium, and ammonia may be used as precursors. Other boron precursors may be used, such as trimethylboron, borane, di-borane, and boron metal. Optimized growth procedures for boron-containing nitrides are described in A. Ougazzaden et al., J. Cryst. Growth 298, 428 (2007), which is incorporated herein by reference.

Incorporating BN into one or more layers of a III-nitride device may be advantageous. Wurtzite III-nitride layers exhibit large polarization, which include both a spontaneous component that is a function of temperature and composition, and a piezoelectric component, which is a function of strain in the layer. Polarization discontinuities at the interface between layers of different composition result in polarization-induced sheet charges and electric fields. The addition of BN may reduce the polarization discontinuity at a GaN/BInGaN interface relative to a GaN/InGaN interface, for example by reducing the strain at the interface. In an n-GaN/BInGaN light emitting layer/p-GaN double heterostructure according to some embodiments, selecting the appropriate BN composition may permit strain, band gap energy, and polarization may be at least partially decoupled, such that any two can be set arbitrarily at the expense of the third. In a conventional GaN/InGaN/GaN heterostructure, only one of strain, band gap energy, and polarization can be independently varied. Reducing the strain in a device by adding BN may permit grown of thicker active regions at higher InN composition.

The semiconductor structures illustrated and described above may be included in any suitable configuration of a light emitting device, such as a device with contacts formed on opposite sides of the device or a device with both contacts formed on the same side of the device. When both contacts are disposed on the same side, the device may be formed either with transparent contacts and mounted such that light is extracted either through the same side on which the contacts are formed, or with reflective contacts and mounted as a flip chip, where light is extracted from the side opposite the side on which the contacts are formed. In devices where light is extracted through the surface on which the contacts are formed, since current does not spread as readily in p-type III-nitride material as in n-type III-nitride material, the contact may include a small, thick, absorbing metal bond pad formed over a thin, transparent current spreading layer. The current spreading layer may be, for example, a thin layer of Ni and/or Au, indium tin oxide, Cu-doped InO, ZnO, Ga-doped ZnO, or any other suitable doped, transparent oxide.

Figure 6:
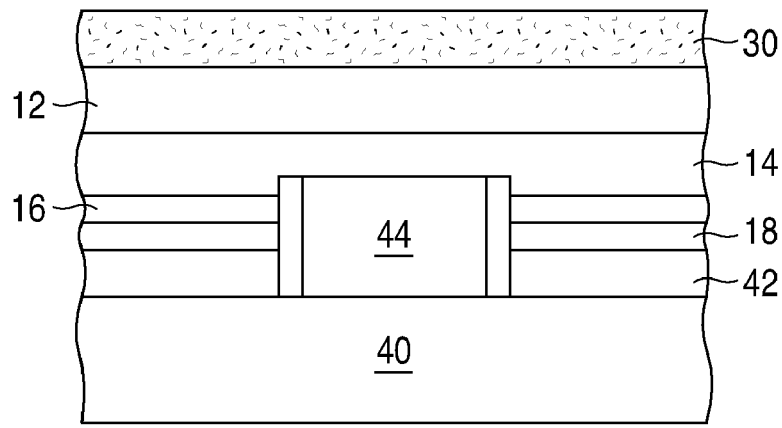
FIG. 6 is a cross sectional view of a portion of a III-nitride device mounted in flip chip configuration on a mount.

FIG. 6 illustrates a portion of one example of a suitable configuration, a flip chip device from which the growth substrate has been removed. A portion of p-type region 18 and light emitting region 16 is removed to form a mesa that exposes a portion of n-type region 14. Though one via exposing n-type region 14 is shown in FIG. 6, it is to be understood that multiple vias may be formed in a single device. N- and p-contacts 44 and 42 are formed on the exposed parts of n-type region 14 and p-type region 18, for example by evaporating or plating. Contacts 42 and 44 may be electrically isolated from each other by air or a dielectric layer.

After contact metals 42 and 44 are formed, a wafer of devices may be diced into individual devices, then each device may be flipped relative to the growth direction and mounted on a mount 40, in which case mount 40 may have a lateral extent larger than that of the device. Alternatively, a wafer of devices may be connected to a wafer of mounts, then diced into individual devices. Mount 40 may be, for example, semiconductor such as Si, metal, or ceramic such as AlN, and may have at least one metal pad (not shown) which electrically connects to p-contacts 42 and at least one metal pad (not shown) which electrically connects to the n-contacts 44. Interconnects (not shown) such as solder or gold stud bumps, connect the semiconductor device to mount 40. Inter-metal dielectrics may be formed on or within mount 40 to electrically isolate the p-type and n-type current paths.

After mounting, the growth substrate is removed by a process suitable to the substrate material, such as etching or laser melting. For example, a sacrificial semiconductor layer (not shown) can be selectively etched to lift off the substrate. A rigid underfill may be provided between the device and mount 40 before or after mounting to support the semiconductor layers and prevent cracking during substrate removal. A portion of the semiconductor structure may be removed by thinning after removing the substrate. For example, first single crystal layer 12 may remain in the finished device, as shown in FIG. 6, or they may be removed by thinning. The exposed surface of the semiconductor structure may be roughened, for example by an etching process such as photoelectrochemical etching or by a mechanical process such as grinding. Roughening the surface from which light is extracted may improve light extraction from the device. Alternatively, a photonic crystal structure may be formed in the top surface of the semiconductor structure exposed by removing the grown substrate. A structure 30 such as a phosphor layer or secondary optics known in the art such as dichroics or polarizers may be applied to the emitting surface.

Figure 7:
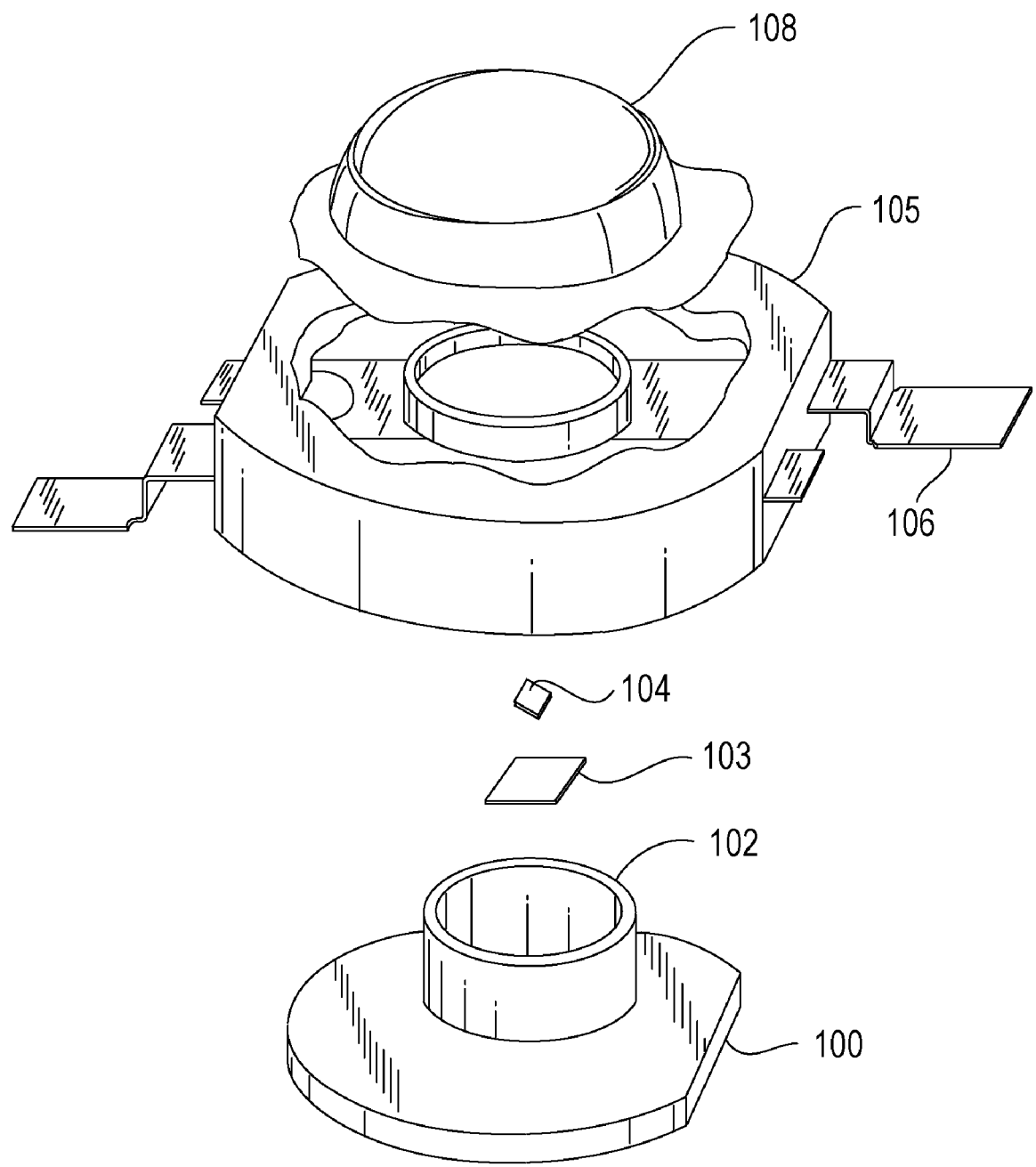
FIG. 7 is an exploded view of a packaged light emitting device.

FIG. 7 is an exploded view of a packaged light emitting device, as described in more detail in U.S. Pat. No. 6,274,924. A heat-sinking slug 100 is placed into an insert-molded leadframe. The insert-molded leadframe is, for example, a filled plastic material 105 molded around a metal frame 106 that provides an electrical path. Slug 100 may include an optional reflector cup 102. The light emitting device die 104, which may be any of the devices described in the embodiments above, is mounted directly or indirectly via a thermally conducting submount 103 to slug 100. A cover 108, which may be an optical lens, may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A structure comprising:
   a III-nitride semiconductor structure comprising a light emitting region disposed between an n-type region and a p-type region, wherein:
   at least one layer in the light emitting region is $B_x(In_yGa_{1-y})_{1-x}N$, wherein the at least one $B_x(In_yGa_{1-y})_{1-x}N$ layer is a light emitting layer, $0.06 \leq x \leq 0.08$, and $0.1 \leq y \leq 0.14$.

2. The structure of claim 1 wherein:
   the light emitting region comprises at least two quantum well light emitting layers separated by a barrier layer.

3. The structure of claim 1 wherein at least a portion of one of the n-type region and the p-type region in direct contact with the light emitting region has a graded composition.

4. The structure of claim 1 further comprising first and second electrical contacts electrically connected to the n-type and p-type regions.

5. The structure of claim 1 wherein the $B_x(In_yGa_{1-y})_{1-x}N$ layer is lattice-matched to GaN.

6. The structure of claim 1 wherein
   the $B_x(In_yGa_{1-y})_{1-x}N$ layer is in compression.

7. A structure comprising:
   a III-nitride semiconductor structure comprising a light emitting region disposed between an n-type region and a p-type region, wherein:
   at least one layer in the light emitting region is $B_x(In_yGa_1)_{1-x}N$, the at least one $B_x(In_yGa_{1-y})_{1-x}N$ layer, $0.08 \leq x \leq 0.11$, and $0.14 \leq y \leq 0.18$.

8. The structure of claim 7 wherein:
   the light emitting region comprises at least two quantum well light emitting layers separated by a barrier layer.

9. The structure of claim 7 wherein at least a portion of one of the n-type region and the p-type region in direct contact with the light emitting region has a graded composition.

10. The structure of claim 7 further comprising first and second electrical contacts electrically connected to the n-type and p-type regions.

11. The structure of claim 7 wherein the $B_x(In_yGa_{1-y})_{1-x}N$ layer is lattice-matched to GaN.

12. A structure comprising:
   a III-nitride semiconductor structure comprising a light emitting region disposed between an n-type region and a p-type region, wherein:

at least one layer in the light emitting region is $B_x(In_yGa_{1-y})_{1-x}N$, the at least one $B_{x(In_y}Ga_{1-y})_{1-x}N$ layer is a light emitting layer, $0.11 \leq x \leq 0.13$, and $0.18 \leq y \leq 0.22$.

13. The structure of claim 12 wherein:

the light emitting region comprises at least two quantum well light emitting layers separated by a barrier layer.

14. The structure of claim 13 wherein:

the light emitting region comprises at least two quantum well light emitting layers separated by a barrier layer; and the barrier layer is $B_x(In_yGa_{1-y})_{1-x}N$ wherein x>0.

15. The structure of claim 13 wherein at least a portion of one of the n-type region and the p-type region in direct contact with the light emitting region has a graded composition.

16. The structure of claim 13 further comprising first and second electrical contacts electrically connected to the n-type and p-type regions.

17. The structure of claim 13 wherein the $B_x(In_yGa_{1-y})_{1-x}N$ layer is lattice-matched to GaN.

18. The structure of claim 13 wherein the $B_x(In_yGa_{1-y})_{1-x}N$ layer is in compression.

* * * * *